(12) United States Patent
Takahashi et al.

(10) Patent No.: US 12,610,512 B2
(45) Date of Patent: Apr. 21, 2026

(54) BOARD MANAGEMENT SYSTEM

(71) Applicant: NEC Corporation, Tokyo (JP)

(72) Inventors: Toru Takahashi, Tokyo (JP); Kengo Makino, Tokyo (JP); Rui Ishiyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 764 days.

(21) Appl. No.: 17/798,126

(22) PCT Filed: Feb. 27, 2020

(86) PCT No.: PCT/JP2020/008068
§ 371 (c)(1),
(2) Date: Aug. 8, 2022

(87) PCT Pub. No.: WO2021/171493
PCT Pub. Date: Sep. 2, 2021

(65) Prior Publication Data
US 2023/0073961 A1 Mar. 9, 2023

(51) Int. Cl.
*H05K 13/04* (2006.01)
*H05K 13/08* (2006.01)

(52) U.S. Cl.
CPC .................................. *H05K 13/083* (2018.08)

(58) Field of Classification Search
CPC ...... H05K 13/083; H05K 13/084; Y02P 90/30
See application file for complete search history.

(56) References Cited

U.S. PATENT DOCUMENTS

| | | | | |
|---|---|---|---|---|
| 5,339,450 A | * | 8/1994 | Nagahara | G06F 11/2736 |
| | | | | 717/176 |
| 6,647,138 B1 | * | 11/2003 | Sakaguchi | H05K 13/0812 |
| | | | | 250/559.29 |
| 11,037,326 B2 | * | 6/2021 | Takahashi | G06T 7/74 |

FOREIGN PATENT DOCUMENTS

| | | |
|---|---|---|
| JP | 2009-117610 A | 5/2009 |
| JP | 2016-178157 A | 10/2016 |
| JP | 2018-113336 A | 7/2018 |

OTHER PUBLICATIONS

International Search Report for PCT Application No. PCT/JP2020/008068, mailed on May 19, 2020.

* cited by examiner

*Primary Examiner* — Paul D Kim
(74) *Attorney, Agent, or Firm* — Sughrue Mion, PLLC

(57) ABSTRACT

A board management system includes an extraction means and a generation means. The extraction means extracts a feature amount that depends on position deviation, for each of a plurality of specific components determined in advance based on a degree of variation in the component mounting position, among a plurality of components in a board image in which a board is captured. The generation means generates individual identification information to be used for identifying a board, from the extracted feature amount.

7 Claims, 13 Drawing Sheets

100 BOARD MANAGEMENT UNIT

152

| BOARD NO. | REGISTRATION IMAGE | INSPECTION RESULT | TEMPLATE IMAGE FLAG |
|---|---|---|---|
| 001 | R_file001 | I_file001 | off |
| 002 | R_file002 | I_file002 | on |
| 003 | R_file003 | I_file003 | off |
| ⋮ | ⋮ | ⋮ | ⋮ |

AVERAGE OF $\theta$ : m$\theta$

AVERAGE OF L : mL

STANDARD DEVIATION OF $\theta$ : Std$\theta$

STANDARD DEVIATION OF L : StdL

VARIATION IN POSITION DEVIATION : SQUARE ROOT VALUE OF
SUM OF SQUARES OF STANDARD DEVIATION $= (\text{Std}\,\theta^2 + \text{StdL}^2)^{1/2}$

FIG. 9

| INFORMATION OF FEATURE AMOUNT EXTRACTION OBJECT COMPONENT |
|---|
| COMPONENT 1,   POSITION INFORMATION,   THRESHOLD |
| COMPONENT 1,   POSITION INFORMATION,   THRESHOLD |
| ⋮ |
| COMPONENT n,   POSITION INFORMATION,   THRESHOLD |
| INFORMATION OF POSITIONING COMPONENT |
| COMPONENT 1,   POSITION INFORMATION |
| COMPONENT 2,   POSITION INFORMATION |
| ⋮ |
| COMPONENT m,   POSITION INFORMATION |

| INDIVIDUAL IDENTIFICATION INFORMATION | BOARD NO. |
|---|---|
| 0110·····011 | 001 |
| 1100·····001 | 002 |
| 0111·····101 | 003 |
| ⋮ | ⋮ |

BOARD MANAGEMENT SYSTEM

This application is a National Stage Entry of PCT/JP2020/008068 filed on Feb. 27, 2020, the contents of all of which are incorporated herein by reference, in their entirety.

TECHNICAL FIELD

The present invention relates to a board management system, a board management method, and a storage medium.

BACKGROUND ART

In the case of manufacturing and selling circuit boards such as printed circuit boards, traceability of circuit boards, or products, is required for the purpose of manufacturing step management, quality inspection, shipping inspection, sales management, and the like. Therefore, individual identification information such as a product name, product number, and the date of manufacture is set to a circuit board to thereby enable the circuit board to be traced based on the individual identification information set.

As a method of setting individual identification information, there is a method of attaching, to a circuit board, a label of a bar code or a QR code (registered trademark) in which individual identification information is printed, or a radio frequency identifier (RFID) in which individual identification information is stored. There is also a method of directly printing individual identification information on a circuit board by means of a laser marker or inkjet. These methods are methods to apply, to a circuit board, individual identification information for identifying the circuit board in order to identify each circuit board.

However, in order to obtain traceability of circuit boards by the method of applying individual identification information to the circuit boards, labels to be attached to the circuit boards and printing facilities for printing on the boards are required. As a result, the manufacturing cost is increased. Moreover, the method of applying individual identification information to circuit boards requires a work of attaching labels to the boards or a work of printing individual identification information on the boards.

In view of the above, a technology of utilizing a feature amount based on the component mounting state of a component mounted on a circuit board as individual identification information of the circuit board has been proposed.

For example, in Patent Literature 1, individual identification information of a circuit board is created based on the outer appearance of a plurality of components whose appearance differs from each other to the level that can be easily distinguishable by the naked eye, among a group of components mounted on the circuit boards.

Further, in Patent Literature 2, individual identification information of a circuit board is created based on fine position deviation of a mounted component that is generated in the component mounting step such as a surface mount technology (SMT) step of the components mounted on the circuit board.

Patent Literature 1: JP 2009-117610 A
Patent Literature 2: JP 2016-178157 A

SUMMARY

However, when comparing mounted components on circuit boards that are mass-produced with the same mounted components on other circuit boards, the number of mounted components whose appearance differs to the level that is easily distinguishable by the naked eye is not so large. Therefore, the number of components that can be used for generating individual identification information is small, and the identification ability that is a degree of identifying a different board is lowered. On the other hand, fine position deviation that is generated in the step of mounting components may be generated in a large number of mounted component on circuit boards because it is very small. Therefore, by extracting a feature amount that depends on position deviation from each of a number of mounted components of the boards, it is possible to increase the identification ability that is a degree of identifying a different board. However, according to the knowledge of the present inventor, even though the number of components from which the feature amount that depends on fine position deviation is increased, only the size of the individual identification information is increased wastefully, and it is difficult to increase the identification ability that is a degree of identifying a different board.

An object of the present invention is to provide a board management system that solves the problem described above.

A board management system according to one aspect of the present invention is configured to include an extraction means for extracting a feature amount that depends on position deviation for each of a plurality of specific components determined in advance based on a degree of variation in a component mounting position, among a plurality of components in a board image in which a board is captured; and a generation means for generating individual identification information to be used for identifying the board from the extracted feature amount.

Further, a board management method according to another aspect of the present invention is configured to include extracting a feature amount that depends on position deviation for each of a plurality of specific components determined in advance based on a degree of variation in a component mounting position, among a plurality of components in a board image in which a board is captured; and generating individual identification information to be used for identifying the board from the extracted feature amount.

Further, a computer-readable storage medium according to another aspect of the present invention is configured to store thereon a program for causing a computer to execute processing to:

extract a feature amount that depends on position deviation for each of a plurality of specific components determined in advance based on a degree of variation in a component mounting position, among a plurality of components in a board image in which a board is captured; and generate individual identification information to be used for identifying the board from the extracted feature amount.

As described above, with the configurations described above, the present invention enables the identification ability that is a degree of identifying a different board to be improved, without wastefully increasing the number of components from which feature amounts that depend on fine position deviation are to be extracted.

BRIEF DESCRIPTION OF DRAWINGS

FIG. 9 illustrates an exemplary format of component information in the board management device according to the first exemplary embodiment of the present invention.

FIG. 11 illustrates an example of an individual identification information DB in the board management device according to the first exemplary embodiment of the present invention.

EXEMPLARY EMBODIMENTS

In the SMT step of a component mounted on a circuit board, after a component such as resistor, a capacitor, or an integrated circuit (IC) is mounted on a portion where a soldering paste is printed on the board, thermal treatment is carried out to join the component to the board. At that time, even for a component that is mounted with slight position deviation with respect to the soldering paste printed on the board, a phenomenon occurs in which such a component is automatically corrected to the correct mounting position due to surface tension of solder melting at the time of reflow. This is called a self-alignment function. Therefore, the position accuracy of component joining is determined by the self-alignment function due to surface tension at the time of solder melting, rather than the accuracy at the time of mounting the component. However, since the self-alignment function involves a relative relationship between the solder surface tension and the component self weight, it is effective in a relatively light component. Accordingly, the degree of variation in position deviation caused in a component soldered to a board by reflow soldering is not the same in the entire components but tends to be different according to the type of component. That is, on a board to which a plurality of components are soldered by reflow soldering, there is a group of components whose variation is position deviation is large, while there is also a group of components whose variation in position deviation is small. Regarding a feature amount that depends on position deviation extracted from a component whose variation in position deviation is small, the possibility that the feature amount differs between different boards is low. Meanwhile, regarding a feature amount that depends on position deviation extracted from a component whose variation in position deviation is large, the possibility that the feature amount differs between different boards is high. The present invention is proposed by focusing on such a viewpoint. The present invention improves the identification ability that is a degree of identifying different boards by determining a component from which a feature amount that depends on position deviation on the basis of the degree of variation in the component mounting position, without wastefully increasing the number of components from which the feature amount that depends on position deviation is extracted, that is, without wastefully increasing the size of the individual identification information. Hereinafter, exemplary embodiments of the present invention will be described in detail with reference to the drawings.

First Exemplary Embodiment

Figure 1:
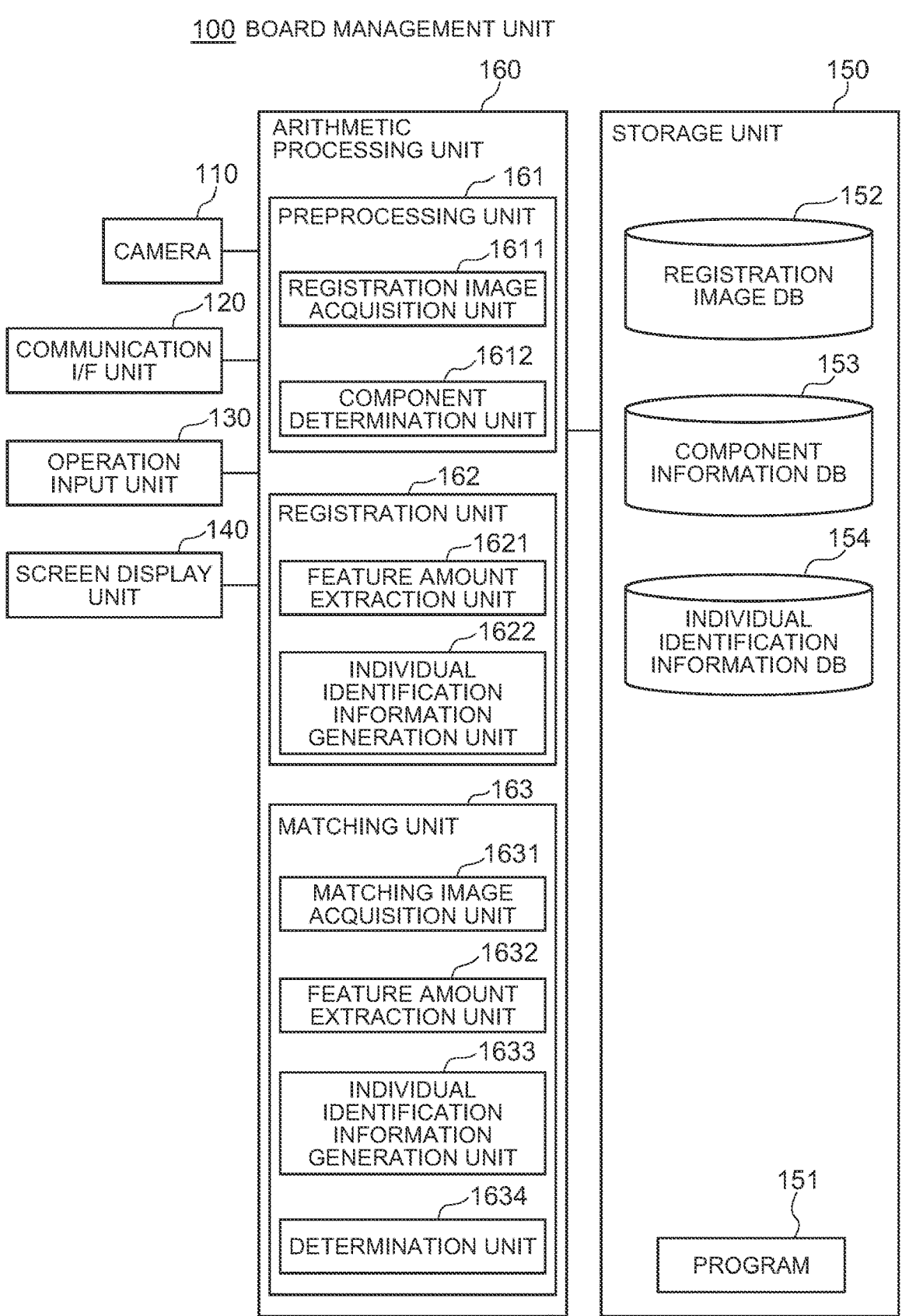
FIG. 1 is a block diagram of a board management device according to a first exemplary embodiment of the present invention.

FIG. 1 is a block diagram of a board management device 100 according to a first exemplary embodiment of the present invention. The board management device 100 illustrated in FIG. 1 is an information processing device that manages individuals of circuit boards on which a plurality of components are mounted, in order to perform manufacturing step management, quality inspection, shipping inspection, sales management, and the like.

Referring to FIG. 1, the board management device 100 includes a camera 110, a communication I/F unit 120, an operation input unit 130, a screen display unit 140, a storage unit 150, and an arithmetic processing unit 160.

The camera 110 is an imaging device that images a circuit board on which a plurality of components are mounted. The camera 110 may be a visible-light color camera equipped with a charge-coupled device (CCD) image sensor or a complementary MOS (CMOS) image sensor having a pixel capacity of about several millions pixels, for example.

The communication I/F unit 120 is configured of a data communication circuit, and is configured to perform data communication with an external device in a wireless or wired manner. The operation input unit 130 is configured of devices such as a keyboard and a mouse, and is configured to detect operation by an operator and output it to the arithmetic processing unit 160. The screen display unit 140 is configured of a device such as a liquid crystal display (LCD), and is configured to display, on a screen, various types of information according to an instruction from the arithmetic processing unit 160.

The storage unit 150 is configured of storage devices such as a hard disk and a memory, and is configured to store therein processing information and a program 151 necessary for various types of processing in the arithmetic processing unit 160. The program 151 is a program for implementing various processing units by being read and executed by the arithmetic processing unit 160, and is read in advance from an external device or a storage medium, not shown, via a data input-output function such as the communication I/F unit 120 and is stored in the storage unit 150. Main processing information stored in the storage unit 150 includes a registration image database (DB) 152, a component information DB 153, and an individual identification information DB 154.

The registration image DB 152 is a database for storing images (registration images), captured by the camera 110, of circuit boards to be registered after the components are mounted thereon.

The component information DB 153 is a database for storing information of a component from which a feature amount that depends on position deviation is extracted for generating individual identification information used for identifying a board.

The individual identification information DB 154 is a database for storing individual identification information of a registration object board.

The arithmetic processing unit 160 includes a processor such as an MPU and the peripheral circuits, and is configured to read and execute the program 151 from the storage unit 150 to allow the hardware and the program 151 to cooperate with each other to thereby implement the various processing units. The main processing units to be implemented by the arithmetic processing unit 160 include a preprocessing unit 161, a registration unit 162, and a matching unit 163.

The preprocessing unit 161 is configured to determine components to be used for generating individual identification information of a board from a group of components mounted on the board. The preprocessing unit 161 includes a registration image acquisition unit 1611 and a component determination unit 1612.

The registration image acquisition unit 1611 is configured to acquire an image (registration image) in which a board to be registered after the components are mounted is captured, from the camera 110, and register it with the registration image DB 152.

The component determination unit 1612 is configured to detect a position deviation amount of each of a plurality of components mounted on a board, from each of the registration images stored in the registration image DB 152. The component determination unit 1612 is also configured to statistically process the detection result of position deviation detected for each component and each registration image, to calculate variation in position deviation for each component. The component determination unit 1612 is also configured to determine a plurality of components to be used for generating individual identification information on the basis of the calculated variation in position deviation of the component. The component determination unit 1612 is configured to register the information of the determined components with the component information DB 153.

The registration unit 162 is configured to generate individual identification information from each of the registration images stored in the registration image DB 152, and register it with the individual identification information DB 154. The registration unit 162 includes a feature amount extraction unit 1621 and an individual identification information generation unit 1622.

The feature amount extraction unit 1621 is configured to extract a feature amount that depends on the position deviation for each component specified by the information of the component stored in the component information DB 153, for each image of the registration object board stored in the registration image DB 152.

The individual identification information generation unit 1622 is configured to generate individual identification information to be used for identifying a board from the feature amount extracted by the feature amount extraction unit 1621, for each image of the registration object board stored in the registration image DB 152, and stores it in the individual identification information DB 154.

The matching unit 163 is configured to perform matching of a board on the basis of the individual identification information. The matching unit 163 includes a matching image acquisition unit 1631, a feature amount extraction unit 1632, an individual identification information generation unit 1633, and a determination unit 1634.

The matching image acquisition unit 1631 is configured to acquire an image (matching image) in which a board to be registered is captured, from the camera 110.

The feature amount extraction unit 1632 is configured to extract a feature amount that depends on the position deviation for each component specified by the information of the component stored in the component information DB 153, from an image of the matching object board acquired by the matching image acquisition unit 1631.

The individual identification information generation unit 1633 is configured to generate individual identification information to be used for identifying a matching object board, from the feature amount of the matching object board extracted by the feature amount extraction unit 1632.

The determination unit 1634 is configured to compare individual identification information of a matching object board generated by the individual identification information generation unit 1633 with individual identification information of a registration object board stored in the individual identification information DB 154 to thereby determine which registration object board the matching object board matches. The determination unit 1634 is also configured to display a determination result on the screen display unit 140 or/and output it to an external device via the communication I/F unit 120.

Figure 2:
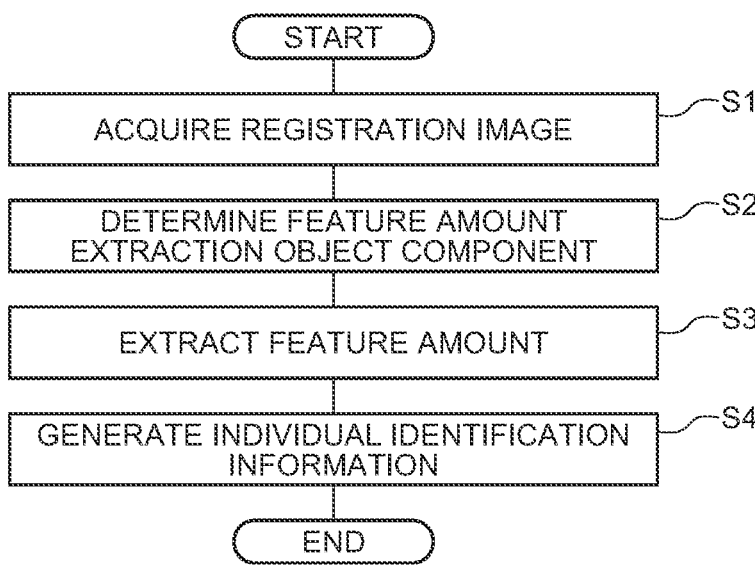
FIG. 2 is a flowchart illustrating examples of a preprocessing operation and a registration operation by the board management device according to the first exemplary embodiment of the present invention.
Figure 3:
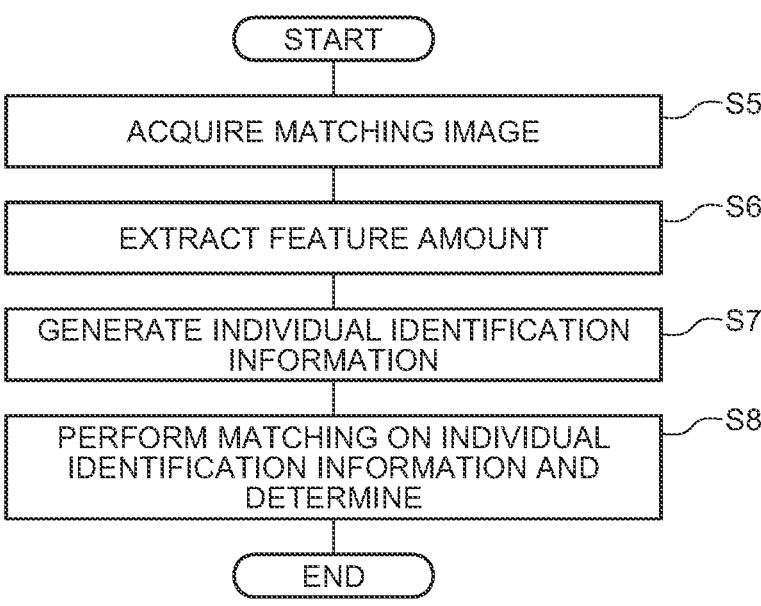
FIG. 3 is a flowchart illustrating an example of a matching operation by the board management device according to the first exemplary embodiment of the present invention.

Next, operation of the board management device 100 will be described. Operation of the board management device 100 is mainly divided into three, namely a preprocessing operation, a registration operation, and a matching operation. FIG. 2 is a flowchart illustrating examples of a preprocessing operation and a registration operation performed by the board management device 100. FIG. 3 is a flowchart showing an example of a matching operation performed by the board management device 100.

First, a preprocessing operation of the board management device 100 will be described. In the preprocessing operation, as illustrated in FIG. 2, the registration image acquisition unit 1611 acquires a plurality of images (registration images) in which a plurality of registration object boards after the components are mounted are captured, from the camera 110, and registers them with the registration image DB 152 (step S1). Then, the component determination unit 1612 reads out a plurality of registration images from the registration image DB 152, detects, from the respective readout registration images, position deviation in the respective components mounted on the respective boards, and based on the variation in the detected position deviation of the respective components and the respective registration images, determines a plurality of components to be used for generating individual identification information, and registers them with the component information DB 153 (step S2). The preprocessing operation ends.

Upon completion of the preprocessing operation, the board management device 100 performs a registration operation. In the registration operation, as illustrated in FIG. 2, the feature amount extraction unit 1621 extracts a feature amount that depends on the position deviation for each component specified by the information of the component stored in the component information DB 153, for each image of the registration object board stored in the registration image DB 152 (step S3). Then, the individual identification information generation unit 1622 generates individual identification information to be used for identifying a board, from the feature amount extracted by the feature amount extraction unit 1621, for each image of a registration object board stored in the registration image DB 152, and stores it in the individual identification information DB 154 (step S4). The registration operation ends.

Next, the matching operation will be described. In the matching operation, as illustrated in FIG. 3, the matching image acquisition unit 1631 acquires an image (matching image) in which a board to be registered is captured, from the camera 110 (step S5). Then, the feature amount extraction unit 1632 extracts a feature amount that depends on the position deviation for each component specified by the information of the component stored in the component information DB 153, from an image of the matching object board acquired by the matching image acquisition unit 1631 (step S6). Then, the individual identification information generation unit 1633 generates individual identification information to be used for identifying a matching object board, from the feature amount of the matching object board extracted by the feature amount extraction unit 1632 (step S7). Then, the determination unit 1634 compares the individual identification information of the matching object board generated by the individual identification information generation unit 1633 with the individual identification information of a registration object board stored in the individual identification information DB 154 to thereby determine which registration object board the matching object board matches, and outputs the determination result (step S8).

Next, the preprocessing unit 161, the registration unit 162, and the matching unit 163 will be described in more detail.

First, the preprocessing unit 161 will be described in detail.

The registration image acquisition unit 1611 captures, with the camera 110, the outer appearance of a board after the components are mounted, manufactured in a circuit board manufacturing step. In general, in the final inspection step of the circuit board manufacturing, the outer appearance of a board is captured for the appearance inspection of the board. The registration image acquisition unit 1611 acquires a board image having been captured for such appearance inspection. Thereby, it is possible to reduce the labor and cost for capturing the same board a plurality of times for the individual management and the appearance inspection separately. However, it is also acceptable to capture a board only for the individual management, of course.

Figure 4:
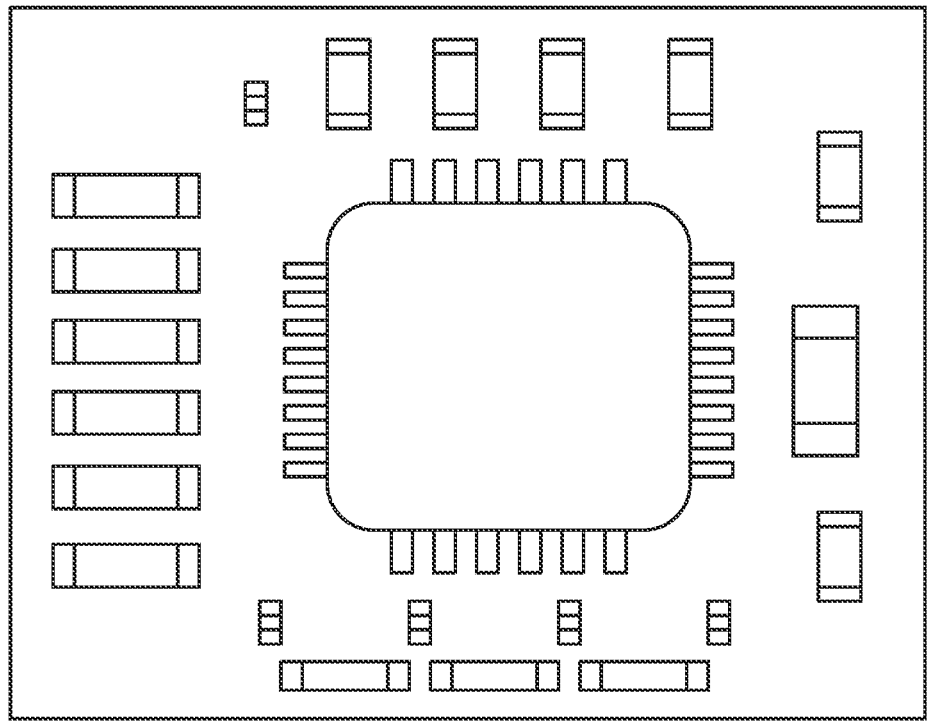
FIG. 4 is a schematic diagram illustrating an exemplary image in which a registration object board according to the first exemplary embodiment of the present invention is captured from the front side.

FIG. 4 is a schematic diagram illustrating an exemplary image in which a registration object board is captured from the front side, acquired by the registration image acquisition unit 1611. In the appearance inspection, binarization for extracting a feature of a part to be inspected and quality determination of the extracted feature part are performed on such an image to derive an inspection result. The registration image acquisition unit 1611 adds related information to the captured board image, and stores it in the registration image DB 152.

Figure 5:
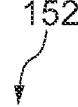
FIG. 5 illustrates an exemplary format of a registration image DB in the board management device according to the first exemplary embodiment of the present invention.

FIG. 5 illustrates an exemplary format of the registration image DB 152. The registration image DB 152 of this example is configured of a plurality of entries, and one entry includes items such as a board number, a registration image, an inspection result, and a template image flag. In the item of board number, a board number such as a serial number assigned to a registration object board is set. In the item of registration image, the name of a file on which an image of a registration object image is recorded is set. In the item of inspection result, the name of a file on which an inspection result of appearance inspection of a registration object board is recorded is set. In the item of template image flag, when the registration image is set as a template image for extracting the feature amount that depends on position deviation, an ON value is set, and if not, an OFF value is set.

Next, the component determination unit 1612 will be described in detail.

Figure 6:
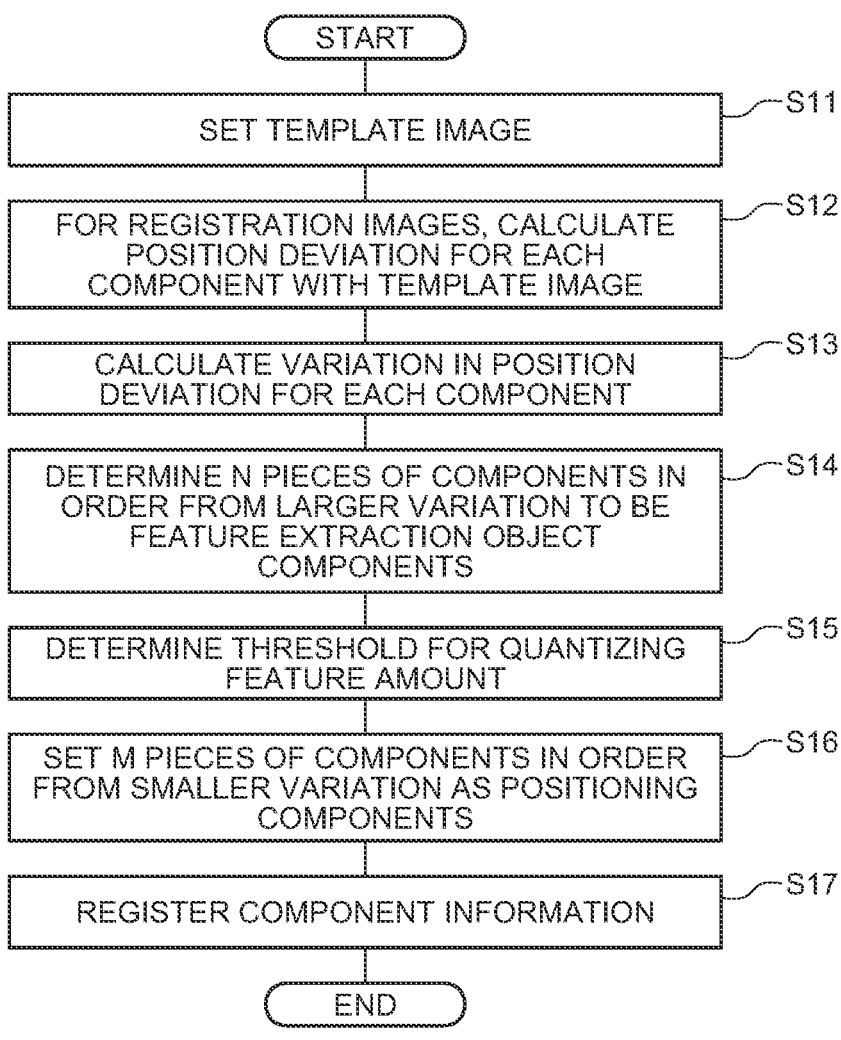
FIG. 6 is a flowchart illustrating an exemplary operation of a component determination unit in the board management device according to the first exemplary embodiment of the present invention.

FIG. 6 is a flowchart showing an exemplary operation of the component determination unit 1612. Referring to FIG. 6, the component determination unit 1612 first sets one of the registration images stored in the registration image DB 152 as a template image (step S11). Any registration image can be set as a template image. For example, the component determination unit 1612 may set any one of the registration images determined to be normal according to the inspection result of the appearance inspection as a template image. In the registration image DB 152 illustrated in FIG. 5, an ON value is set in the item of template image flag in the entry of the board number 002 and an OFF value is set in each of the items of template image flags in the other entries. That is, the component determination unit 1612 sets the registration image of the board number 002 as a template image.

Then, the component determination unit 1612 reads out a plurality of registration images from the registration image DB 152 and with respect to the readout registration images, calculates position deviation of each component between it and the template image (step S12). Here, the registration images to be read out from the registration image DB 152 may be the entire registration images stored in the registration image DB 152 or a predetermined number of pieces of registration images that are sampled at random for example. In the below description, it is assumed that S pieces of registration images are read out. As a method of calculating position deviation of each component between the registration image and the template image, any method may be used. For example, the component determination unit 1612 may detect position deviation of each component in the registration image from the corresponding component in the template image by calculating an optical flow between the template image and the registration image. Before calculating an optical flow, it is possible to perform positioning between the template image and the registration image, on the basis of edges of the boards in the images for example.

Figure 7:
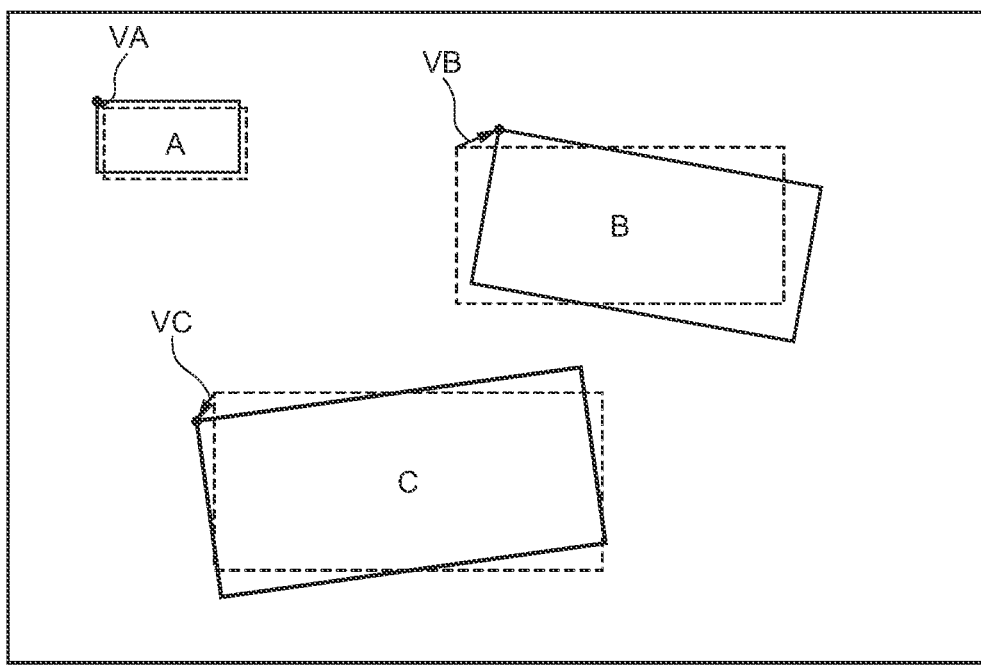
FIG. 7 is a schematic diagram explaining position deviation of components in the first exemplary embodiment of the present invention.

FIG. 7 is a schematic diagram for explaining position deviation of components. When the template image and the registration image are superimposed in such a manner that the edges of the boards in the images match with each other, in the case of a component with no position deviation, as illustrated with a component A, the contour of the component A in the registration image shown by a solid line and the contour of the component A in the template image shown by a dotted line match with each other. On the contrary, in the case of a component with position deviation, as illustrated with components B and C, the contours of the components B and C shown by solid lines in the registration image and the contours of the components B and C shown by dotted lines in the template image are deviated from each other. When the feature point for calculating position deviation is a specific edge (for example, upper left vertex) of the component, a vector VB in which the specific edge of the component B in the template image is the start point and the specific edge of the component B in the registration image is the end point represents position deviation of the component B. Similarly, vectors VA and VC represent the position deviation of the components A and C, respectively. Note that the vector VA is a zero vector.

Then, the component determination unit 1612 calculates variation in the position deviation of each component (step S13). As a method of calculating variation in the position deviation of each component, any method may be used. For example, the component determination unit 1612 may calculate variation in the position deviation of each component by the method as described below.

Figure 8:
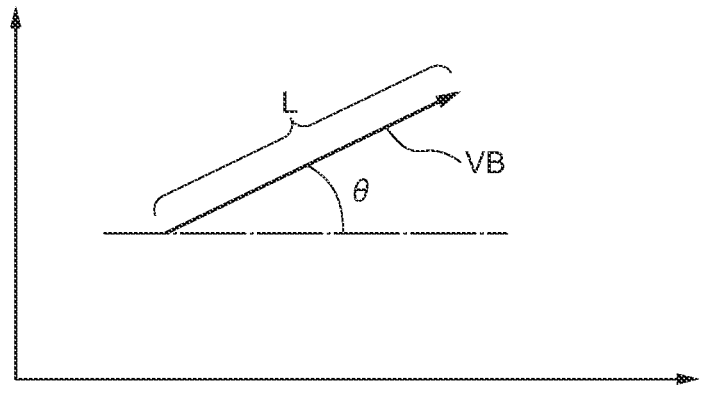
FIG. 8 is a schematic diagram explaining a method of calculating variation in position deviation of components in the first exemplary embodiment of the present invention.

FIG. 8 is a schematic diagram explaining a method of calculating variation in the position deviation of a component. In FIG. 8, the vector VB is a vector representing the position deviation of the component B in a registration image. For example, when an XY coordinate is set in which a line segment along the bottom side of the board in the template image is an X axis and a line segment vertical to the X axis is a Y axis, the vector VB is resolved into a length L and an angle $\theta$ from the X axis. Then, the component determination unit 1612 first calculates, from the position deviation vector VB of the component B in S pieces of registration images, an average value $m\theta$ of $\theta$ and an average value mL of L, and based on them, calculates a standard deviation StdL of L. Then, the component determination unit 1612 calculates a square root value of the sum of squares of the standard deviation $(\text{Std}\theta^2+\text{StdL}^2)^{1/2}$, and determines the calculation result to be the variation in position deviation of the component B. The component determination unit 1612 also calculates variation in position deviation for the components other than the component B by means of the same method.

Then, the component determination unit 1612 determines n pieces of components in the order from larger variation to be feature amount extraction object components (step S14). Here, n represents a predetermined positive integer or 2 or larger.

Then, the component determination unit 1612 determines a threshold for quantizing the feature amount for each of then pieces of feature amount extraction object components (step S15). For example, when the length of a position deviation vector is quantized into a binary value, for each of the n pieces of feature amount extraction object components, the component determination unit 1612 sorts the entire lengths (S pieces of lengths) of the position deviation vectors of the component in the ascending order, and determines a value at the position of 50% from the bottom of the order sorted in the ascending order to be one threshold TH for quantizing the length of the position deviation vector of the component to a binary value. In the case of quantizing the length of a position deviation vector into a ternary value, the component determination unit 1612 determines values at the positions of 33% and 66% from the bottom of the order to be two thresholds THL and THH for quantizing the length of the position deviation vector of the component into a ternary value, respectively. The component determination unit 1612 determines a threshold for quantizing the direction of a position deviation vector in the same manner as described above.

Then, the component determination unit 1612 determines m pieces of components in the order from smaller variation to be positioning components (step S16). Here, m represents a predetermined positive integer of 2 or larger.

Then, the component determination unit 1612 stores information about the feature amount extraction object components, the thresholds, and the positioning components determined as described above in the component information DB 153, as illustrated in FIG. 9.

Figure 10:
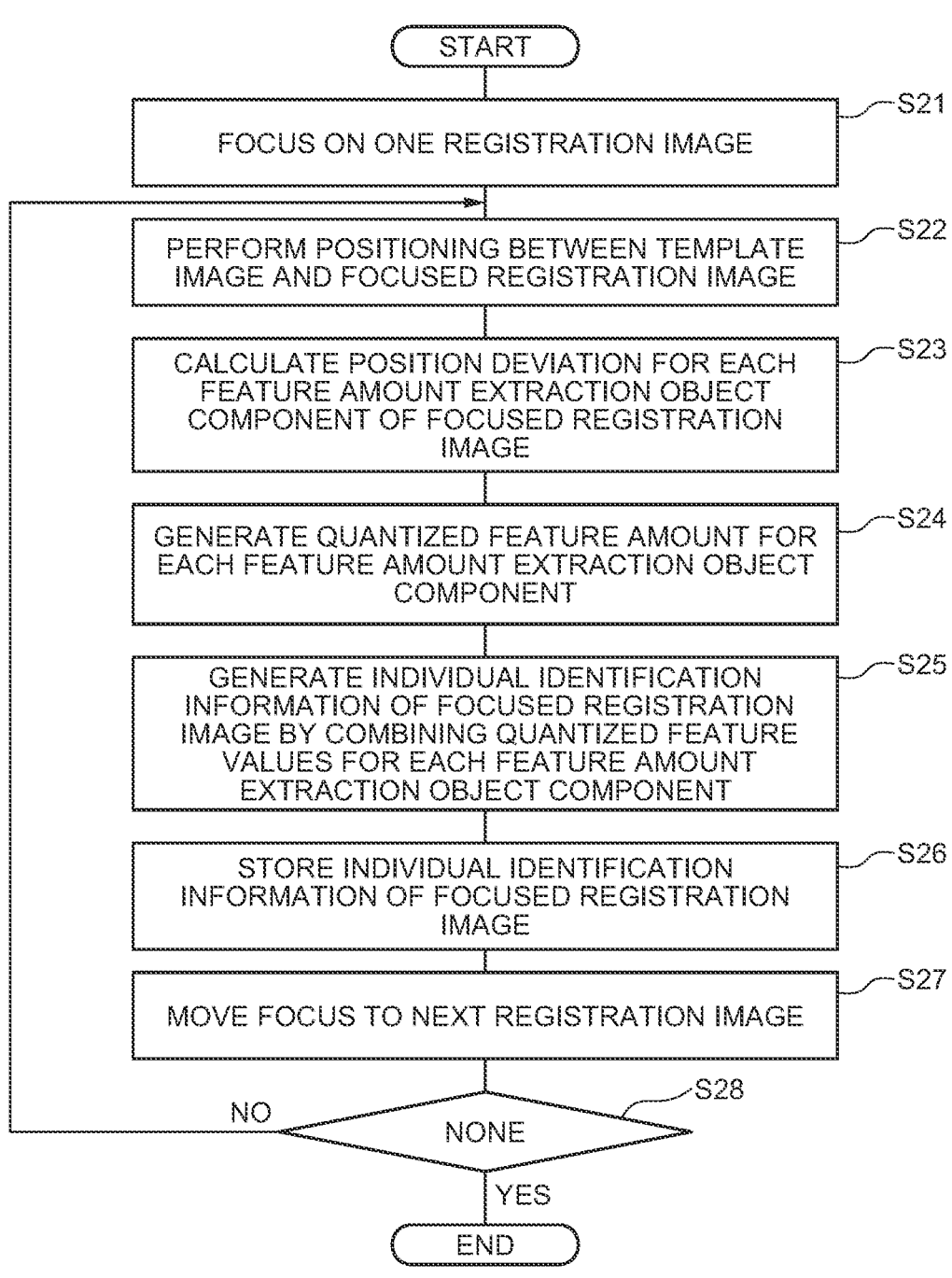
FIG. 10 is a flowchart illustrating the details of an operation of a registration unit in the board management device according to the first exemplary embodiment of the present invention.

Next, the registration unit 162 will be described in detail with reference to FIG. 10. FIG. 10 is a flowchart illustrating an operation of the registration unit 162.

First, the feature amount extraction unit 1621 of the registration unit 162 focuses on one registration image in the registration image group stored in the registration image DB 152 (step S21). Then, the feature amount extraction unit 121 performs positioning on the template image set in the registration image DB 152 and the focused registration image (step S22). At that time, the feature amount extraction unit 121 reads out the position information of m pieces of positioning components from the component information DB 153, and performs positioning between the two images in such a manner that the m pieces of components in the template image identified therefrom and the m pieces of components in the focused registration image match with each other.

Then, the feature amount extraction unit 1621 reads out position information of n pieces of feature amount extraction object components from the component information DB 153, and calculates position deviation vectors v1, v2, . . . , vn of predetermined feature points of the n pieces of components in the focused registration image identified therefrom (step S23).

Then, the feature amount extraction unit 1621 reads out thresholds TH1, TH2, . . . , THn of the n pieces of feature amount extraction object components from the component information DB 153, and quantizes the lengths vl1, vl2, . . . , vln and the directions $v\theta1$, $v\theta2$, . . . , $v\theta n$ of the position deviation vectors v1, v2, . . . , vn of the n pieces of components calculated from the focused registration image using those thresholds into Ql1, Ql2, . . . , Qln and $Q\theta1$, $Q\theta2$, . . . , $Q\theta n$ (step S24).

For example, when quantizing into a binary value, the feature amount extraction unit 1621 quantizes a length vli of a position deviation vector vi (i represents any of 1 to n) into a quantization value Qli, in accordance with, for example, Expression 1 provided below. THli represents a threshold for quantizing the length vli of the vector vi into a binary value.

$$Qli = +1(vli < THli) \qquad (1)$$
$$= 0(vli \geq THli)$$

Further, when quantizing into a binary value, the feature amount extraction unit 1621 quantizes a direction $v\theta i$ of the position deviation vector vi into a quantization value $Q\theta i$, in accordance with, for example, Expression 2 provided below. $TH\theta i$ represents a threshold for quantizing the direction $v\theta i$ of the vector vi into a binary value.

$$Q\theta i = +1(0 \leq v\theta i < TH\theta i) \qquad (2)$$
$$= 0(TH\theta i \leq v\theta i < 360°)$$

Further, when quantizing into a ternary value, the feature amount extraction unit 1621 quantizes the length vli of the position deviation vector vi into a quantization value Qli, in accordance with, for example, Expression 3 provided below.

THIHi and THILi (THIHi>THILi) represent thresholds for quantizing the length vli of the vector vi into a ternary value.

$$Qli = +1 (vli < THIli) \qquad (3)$$
$$= 0 (THILi \le vli < THIHi)$$
$$= -1 (vli \ge THIHi)$$

Further, when quantizing into a ternary value, the feature amount extraction unit 1621 quantizes the direction vθi of the position deviation vector vi into a quantization value Qθi, in accordance with, for example, Expression 4 provided below. THθHi and THθLi (THθHi>THθLi) represent thresholds for quantizing the direction vθi of the vector vi into a ternary value.

$$Q\theta i = +1 (0 < v\theta i < TH\theta li) \qquad (4)$$
$$= 0 (TH\theta Li \le v\theta i < TH\theta Hi)$$
$$= -1 (TH\theta Hi \le v\theta i < 360°)$$

Then, the individual identification information generation unit 1622 combines the quantized feature amounts of each feature amount extraction object component to generate individual identification information of the focused registration image (step S25). For example, the individual identification information generation unit 1622 may generate individual identification information by connecting the quantized feature amount in the order of entry of the information of the feature amount extraction object component stored in the component information DB 153. Assuming that the number of bits of the quantized feature amount of one feature amount extraction object component is p bits, the size of the individual identification information is p by n bits. Then, the individual identification information 1622 stores the individual identification information of the focused registration image in the individual identification information DB 154 (step S26).

After storing the individual identification information of the focused registration image in the individual identification information DB 154, the registration unit 162 moves focus to another remaining registration image stored in the registration image DB 152 (step S27), and returns to step S22 to repeat the same processing as that described above. Upon completion of focusing on all registration images stored in the registration image DB 152 (YES at step S28), the registration unit 162 ends the processing of FIG. 10.

FIG. 11 illustrates an exemplary format of the individual identification information DB 154. The individual identification information DB 154 of this example is configured of a plurality of entries corresponding to registration images one to one, and each entry includes items such as individual identification information and a board number. In the item of individual identification information, individual identification information generated from a registration image is set. In the item of board number, a board number assigned to the registration image in the registration image DB 152 is set.

Figure 12:
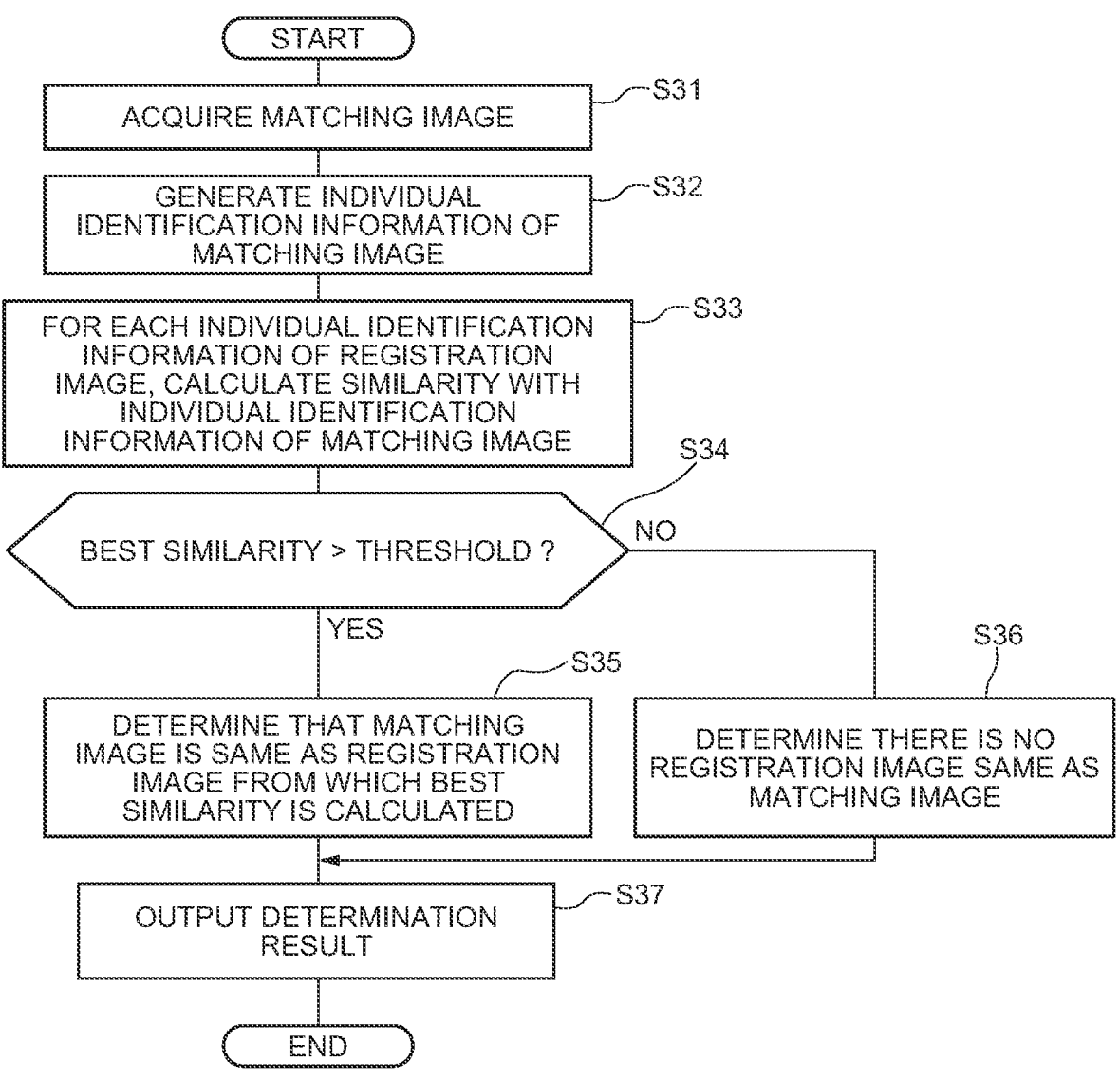
FIG. 12 is a flowchart illustrating the details of an operation of a matching unit in the board management device according to the first exemplary embodiment of the present invention.

Next, the matching unit 163 will be described in detail with reference to FIG. 12. FIG. 12 is a flowchart illustrating the details of the operation of the matching unit 163.

First, the matching image acquisition unit 1631 of the matching unit 163 acquires an image (matching image) in which a matching object board is captured, from the camera 110 (step S31). Then, the feature amount extraction unit 1632 and the individual identification information generation unit 1633 perform processing that is the same as that performed by the feature amount extraction unit 1621 and the individual identification information generation unit 1622 of the registration unit 162 on the matching image to generate individual identification information from the matching image (step S32).

Then, for each individual identification information of a registration image stored in the individual identification information DB 154, the determination unit 1634 calculates the similarity between it and the individual identification information of the matching image (step S33). For example, when the individual identification information is represented in p by n bits as described above, a Hamming distance between the p×n bits representing the individual identification information of the registration image and the p by n bits representing the individual identification information of the matching image may be calculated as the similarity. In that case, it is shown that as the similarity value is close to 0, the degree of similarity between the individual identification information of the registration image and the individual identification information of the matching image is high. Then, the determination unit 1634 determines whether or not the best similarity in the calculated similarities is larger than a threshold (step S34). In the case of using the Hamming distance as a similarity, it is determined whether or not the Hamming distance indicating the best similarity is smaller than a threshold. When the best similarity is larger than the threshold, the determination unit 1634 determines that the circuit board of the matching image is the same as the circuit board of the registration image having the individual identification information in which the best similarity is calculated (step S35). On the other hand, when the best similarity is smaller than the threshold, the determination unit 1634 determines that a circuit board that is the same as the circuit board of the matching image is not registered (step S36). Then, the determination unit 1634 outputs the determination result (step S37). At that time, the determination unit 1634 may read out the board number of the circuit board determined to be the same as the circuit board of the matching image and the inspection result from the registration image DB 152 and output them together with the determination result.

As described above, according to the present embodiment, it is possible to increase the identification ability that is a degree of identifying a different board, without wastefully increasing the number of components from which feature amounts that depend on fine position deviation are extracted. This is because feature amounts that depend on position deviation are extracted from a limited number of, that is, n pieces from the top of, components having larger variations in position deviation from a group of components mounted on the board.

Next, a modification of the present embodiment will be described.

In the above description, the component determination unit 1612 detects position deviation of each component in each registration image, from each of a plurality of registration images in which a plurality of boards are captured. However, the component determination unit 1612 may measure position deviation of each component on a plurality of boards by using a three-dimensional shape measurement device.

In the above description, the component determination unit 1612 determines a feature amount extraction object component on the basis of variation in position deviation of each component on the board. However, the component determination unit 1612 may calculate a score indicating the degree that a self-alignment effect can be expected for a plurality of components soldered to the board by reflow soldering in the group of components on the board, and based on the score, determine a feature amount extraction object component. For example, as described above, since the self-alignment function involves a relative relationship between the solder surface tension and the component self weight, it is effective in a light component. Therefore, it is considered that variation in position deviation may be small in a light component in the group of components on the board. On the contrary, since the self-alignment function does not work sufficiently in a heavy component, it is considered that variation in position deviation is large. Accordingly, the component determination unit 1612 may calculate a score that is higher as the weight is lighter on the basis of the weight of each component on the board, and determine n pieces of components from the bottom of the score to be feature amount extraction object components. Alternatively, since the surface area of a component when a board is captured from the front tends to be smaller as the weight of the component is lighter, it is possible to calculate a score that is higher as the surface area of the component is smaller, and determine n pieces of components from the bottom of the score to be feature amount extraction object components.

In the above description, the feature amount extraction unit 1621 performs positioning between the template image and the registration image by using positioning components stored in the component information DB 153. However, the feature amount extraction unit 1621 may perform positioning between the template image and the registration image on the basis of edges of the boards, for example.

In the above description, the feature amount extraction unit 1621 calculates a position deviation vector of a feature point of a component in the registration image and a feature point of a component in the template image as a feature amount that depends on the position deviation of the component in the registration image. However, as similar to the method described in Patent Literature 2, the feature amount extraction unit 1621 may extract an edge from a board image in the registration images, and on the basis of the extracted edge, calculate the feature amount related to the position of the feature amount extraction object component as a feature amount that depends on the position deviation of the component. Further, the feature amount that depends of the position deviation of the feature amount extraction object component may be hue information or luminance information of a component region, rather than position information. Further, the feature amount extraction unit 1621 may use a feature based on the statistic amount of the gradient of luminance calculated from the luminance information of the component region, frequency characteristics obtained by Fourier transform of the luminance information or the like, or a binary feature obtained from the magnitude relation of the luminance of any pixel pair taken out from a component region, as a feature amount that depends on the position deviation of the feature amount extraction object component.

In the above description, the feature amount extraction unit 1621 quantizes the length vli and the direction vθi of the position deviation vector vi between a feature point of a component in a registration image and a feature point of a component in a template image into Qli and Qθi, respectively, and the individual identification information generation unit 1622 generates individual identification information by connecting the quantized values of each component. However, the feature amount extraction unit 1621 may transmit the position deviation vector vi extracted for each component to the individual identification information generation unit 1622 as it is without quantizing it, and the individual identification information generation unit 1622 may generate a vector string (v1, v2, . . . , vn) in which position deviation vectors vi of each component are simply aligned, as individual identification information. In the case of using individual identification information in such a form, the determination unit 1634 may calculate a cosine distance (cosine similarity) or Euclidean distance of two position deviation vectors vi for each corresponding component between the individual identification information of the registration image and the individual identification information of the matching image, and calculate their total sum as a similarity of the two pieces of individual identification information. Such similarity calculation can be applied to the case of using a feature amount such as luminance gradient obtained from the luminance information described above.

In the above description, the determination unit 1634 handles n pieces of feature amount extraction object components equally to calculate the similarity between the individual identification information of a registration image and the individual identification information of a matching image. However, there is a difference in the degree of variation in position deviation among the n pieces of feature amount extraction object components. It is considered that components having larger degree of variation in position deviation have higher identification ability that is a degree of identifying a different board, compared with components having smaller degree of variation. Therefore, not only determining n pieces of components in the descending order of variation to be feature amount extraction object components, the component determination unit 1612 may give a larger weight to a component having a larger degree of variation in position deviation and give a smaller weight to a component having a smaller degree of variation in position deviation. Then, in consideration of the weight of the component, the determination unit 1634 may calculate the similarity between the individual identification information of the registration image and the individual identification information of the matching image. For example, the determination unit 1634 may apply a larger weight to the similarity between the feature amounts having larger variation and apply a smaller weight to the similarity between the feature amounts having smaller variation, and calculate a matching score (final similarity) using the weighted sum.

In the above description, one board management device 100 includes the preprocessing unit 161, the registration unit 162, and the matching unit 163. However, a board management device that includes the preprocessing unit 161 but does not include the registration unit 162 and the matching unit 163, a board management device that includes the registration unit 162 but does not include the preprocessing unit 161 and the matching unit 163, and a board management device that includes the matching unit 163 but does not include the preprocessing unit 161 and the registration unit 162 may be acceptable. Alternatively, a board management device that includes two of the preprocessing unit 161, the registration unit 162, and the matching unit 163 and does not include the rest is also acceptable.

Second Exemplary Embodiment

Next, a second exemplary embodiment of the present invention will be described with reference to FIG. 13. FIG.

13 is a block diagram illustrating a configuration of a board management system according to the present embodiment.

Figure 13:
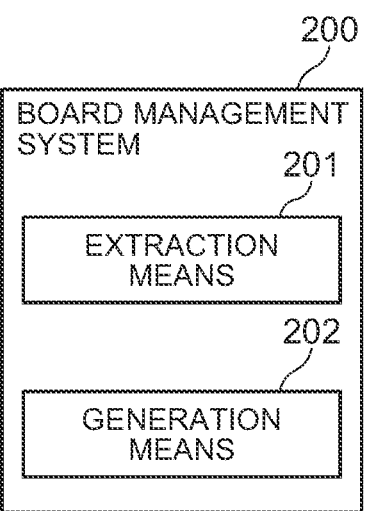
FIG. 13 is a block diagram of a board management device according to a second exemplary embodiment of the present invention.

As illustrated in FIG. 13, a board management system 200 of the present embodiment includes an extraction means 201 and a generation means 202.

The extraction means 201 is configured to extract a feature amount that depends on position deviation for each of a plurality of specific components determined in advance based on the variation degree in the component mounting position, among a plurality of components in a board image in which a board is captured. The extraction means 201 can be implemented by the feature amount extraction unit 1621 or the feature amount extraction unit 1632 in FIG. 1 for example, but is not limited thereto.

The generation means 202 is configured to generate individual identification information to be used for identification of a board, from the feature amount extracted by the extraction means 201. The generation means 202 can be implemented by the individual identification information generation unit 1622 or the individual identification information generation unit 1633 of FIG. 1 for example, but is not limited thereto.

The board management system 200 configured as described above operates as described below. First, the extraction means 201 extracts a feature amount that depends on position deviation for each of a plurality of specific components determined in advance based on the variation degree in the component mounting position, among a plurality of components in a board image in which a board is captured. Then, the generation means 202 generates individual identification information to be used for identifying a board, from the feature amount extracted by the extraction means 201.

Since the board management system 200 according to the present embodiment is configured and operates as described above, it is possible to increase the identification ability that is a degree of identifying a different board, without wastefully increasing the number of components from which a feature amount that depends on the position deviation is extracted. This is because a feature amount that depends on the position deviation is extracted for each of a plurality of specific components determined in advance based on the variation degree in the component mounting position, among a plurality of components in a board image.

While the present invention has been described with reference to the exemplary embodiments described above, the present invention is not limited to the above-described embodiments. The form and details of the present invention can be changed within the scope of the present invention in various manners that can be understood by those skilled in the art.

INDUSTRIAL APPLICABILITY

The present invention is applicable to generation of individual identification information that uniquely identifies a circuit boards on which a plurality of components are mounted, and in particular, applicable to generation of individual identification information of a circuit board on which a plurality of components, joined to the board by reflow soldering, are mounted.

The whole or part of the exemplary embodiments disclosed above can be described as, but not limited to, the following supplementary notes.

(Supplementary Note 1)

A board management system comprising:

extraction means for extracting a feature amount that depends on position deviation for each of a plurality of specific components determined in advance based on a degree of variation in a component mounting position, among a plurality of components in a board image in which a board is captured; and generation means for generating individual identification information to be used for identifying the board from the extracted feature amount.

(Supplementary Note 2)

The board management system according to supplementary note 1, further comprising determination means for detecting, from each of a plurality of board images in which a plurality of boards are captured, position deviation of each of the plurality of components in the board image, and determining the plurality of specific components on a basis of variation in position deviation of each of the components.

(Supplementary Note 3)

The board management system according to supplementary note 1, further comprising determination means for calculating a score representing a degree that a self-alignment effect is expectable for a plurality of components soldered to the board by reflow soldering, and based on the score, determining the plurality of specific components.

(Supplementary Note 4)

The board management system according to any of supplementary notes 1 to 3, further comprising registration means for storing the generated individual identification information in a database as individual identification information of the board.

(Supplementary Note 5)

The board management system according to any of supplementary notes 1 to 4, further comprising matching means for performing matching between the generated individual identification information and individual identification information of a registration object board having been generated and registered with a database in advance.

(Supplementary Note 6)

A board management method comprising:

extracting a feature amount that depends on position deviation for each of a plurality of specific components determined in advance based on a degree of variation in a component mounting position, among a plurality of components in a board image in which a board is captured; and generating individual identification information to be used for identifying the board from the extracted feature amount.

(Supplementary Note 7)

The board management method according to supplementary note 6, further comprising detecting, from each of a plurality of board images in which a plurality of boards are captured, position deviation of each of the plurality of components in the board image, and determining the plurality of specific components on a basis of variation in position deviation of each of the components.

(Supplementary Note 8)

The board management method according to supplementary note 6, further comprising calculating a score representing a degree that a self-alignment effect is expectable for a plurality of components soldered to the board by reflow soldering, and based on the score, determining the plurality of specific components.

(Supplementary Note 9)

The board management method according to any of supplementary notes 6 to 8, further comprising storing the generated individual identification information in a database as individual identification information of the board.

(Supplementary Note 10)

The board management method according to any of supplementary notes 6 to 9, further comprising performing matching between the generated individual identification information and individual identification information of a registration object board having been generated and registered with a database in advance.

(Supplementary Note 11)

A computer-readable storage medium storing thereon a program for causing a computer to perform processing of:

extracting a feature amount that depends on position deviation for each of a plurality of specific components determined in advance based on a degree of variation in a component mounting position, among a plurality of components in a board image in which a board is captured; and generating individual identification information to be used for identifying the board from the extracted feature amount.

REFERENCE SIGNS LIST 100 board management device
110 camera
120 communication I/F unit
130 operation input unit
140 screen display unit
150 storage unit
160 arithmetic processing unit

What is claimed is:

1. A board management system comprising:
a memory containing program instructions; and
a processor coupled to the memory, wherein the processor is configured to execute the program instructions to:
determine a plurality of specific components from a plurality of components on a board;
extract a feature amount that depends on a position deviation for each of the plurality of specific components determined; and
generate an individual identification information that uniquely identifies the board from the extracted feature amount,
wherein the processor is configured to further execute the program instructions to:
calculate a score representing a degree that a self-alignment effect is expectable for a plurality of components soldered to the board by reflow soldering, among of the plurality of components on the board, and
determine the plurality of specific components based on the score.

2. The board management system according to claim 1, wherein the processor is further configured to execute the program instructions to store the generated individual identification information in a database as individual identification information of the board.

3. The board management system according to claim 1, wherein the processor is further configured to execute the program instructions to perform matching between the generated individual identification information and individual identification information of a registration object board having been generated and registered with a database in advance.

4. A board management method comprising:

determining a plurality of specific components from a plurality of components on a board;

extracting a feature amount that depends on position deviation for each of the plurality of specific components determined; and generating an individual identification information that uniquely identifies the board from the extracted feature amount, wherein the determining the plurality of specific components comprises:

calculating a score representing a degree that a self-alignment effect is expectable for a plurality of components soldered to the board by reflow soldering, among of the plurality of components on the board, and determining the plurality of specific components based on the score.

5. The board management method according to claim 4, further comprising storing the generated individual identification information in a database as individual identification information of the board.

6. The board management method according to claim 4, further comprising performing matching between the generated individual identification information and individual identification information of a registration object board having been generated and registered with a database in advance.

7. A non-transitory computer-readable storage medium storing thereon a program comprising instructions for causing a computer to execute processing to:

determine a plurality of specific components from a plurality of components on a board;

extract a feature amount that depends on a position deviation for each of the plurality of specific components determined; and generate an individual identification information that uniquely identifies the board from the extracted feature amount, wherein the determining the plurality of specific components comprises:

calculating a score representing a degree that a self-alignment effect is expectable for a plurality of components soldered to the board by reflow soldering, among of the plurality of components on the board, and determining the plurality of specific components based on the score.

* * * * *